(12) United States Patent
Cazaux et al.

(10) Patent No.: US 7,687,872 B2
(45) Date of Patent: Mar. 30, 2010

(54) BACK-LIT IMAGE SENSOR WITH A UNIFORM SUBSTRATE TEMPERATURE

(75) Inventors: Yvon Cazaux, Grenoble (FR); Philippe Coronel, Barraux (FR); Claire Fenouillet-Béranger, Grenoble (FR); François Roy, Seyssins (FR)

(73) Assignees: STMicroelectronics (Crolles) 2 SAS, Crolles (FR); Commissariat A l'Energie Atomique, Paris (FR)

( * ) Notice: Subject to any disclaimer, the term of this patent is extended or adjusted under 35 U.S.C. 154(b) by 162 days.

(21) Appl. No.: 11/880,253

(22) Filed: Jul. 20, 2007

(65) Prior Publication Data
US 2008/0017946 A1    Jan. 24, 2008

(30) Foreign Application Priority Data
Jul. 24, 2006    (FR) .................................. 06 53082

(51) Int. Cl.
*H01L 31/00* (2006.01)
(52) U.S. Cl. ................. 257/447; 257/460; 257/E31.11; 438/48
(58) Field of Classification Search .................. 257/431, 257/432, 447, 460, E31.11, E31.084, E31.126, 257/E31.001, E21.001, 228, 294; 438/57, 438/87, 48, 60
See application file for complete search history.

(56) References Cited

U.S. PATENT DOCUMENTS

| 2005/0227403 A1* | 10/2005 | Muramatsu .................. 438/57 |
| 2006/0091290 A1* | 5/2006 | Yoshihara et al. ........ 250/208.1 |
| 2006/0094151 A1 | 5/2006 | Sumi |

OTHER PUBLICATIONS

French Search Report from French Patent Application 06/53082, filed Jul. 24, 2006.

* cited by examiner

*Primary Examiner*—Thomas L Dickey
*Assistant Examiner*—Fazli Erdem
(74) *Attorney, Agent, or Firm*—Lisa K. Jorgenson; James H. Morris; Wolf, Greenfield & Sacks, P.C.

(57) ABSTRACT

An image sensor including photosensitive cells including photodiodes and at least one additional circuit with a significant heat dissipation including transistors. The image sensor is made in monolithic form and includes a layer of a semiconductor material having first and second opposite surfaces and including, on the first surface side, first regions corresponding to the power terminals of the transistors, the lighting of the image sensor being intended to be performed on the second surface side; a stack of insulating layers covering the first surface; a thermally conductive reinforcement covering the stack on the side opposite to the layer; and thermally conductive vias connecting the layer to the reinforcement.

9 Claims, 4 Drawing Sheets

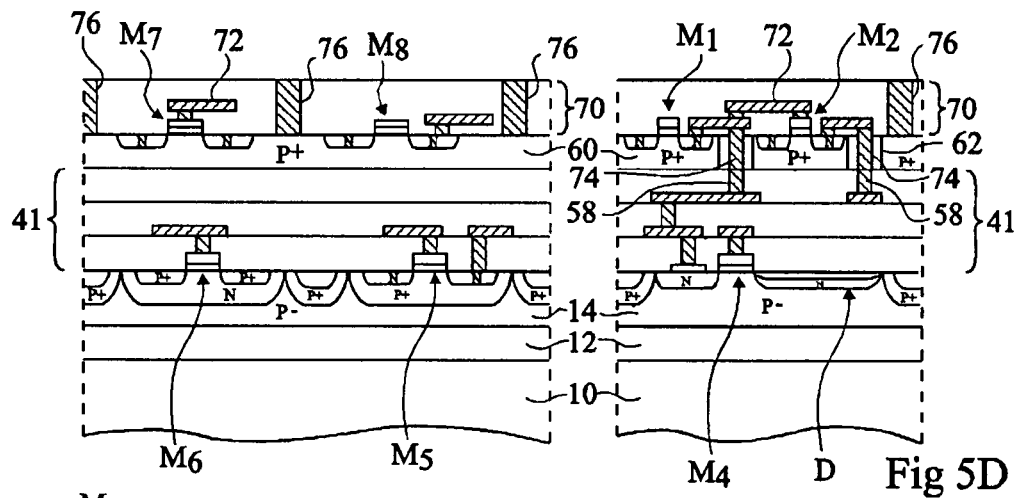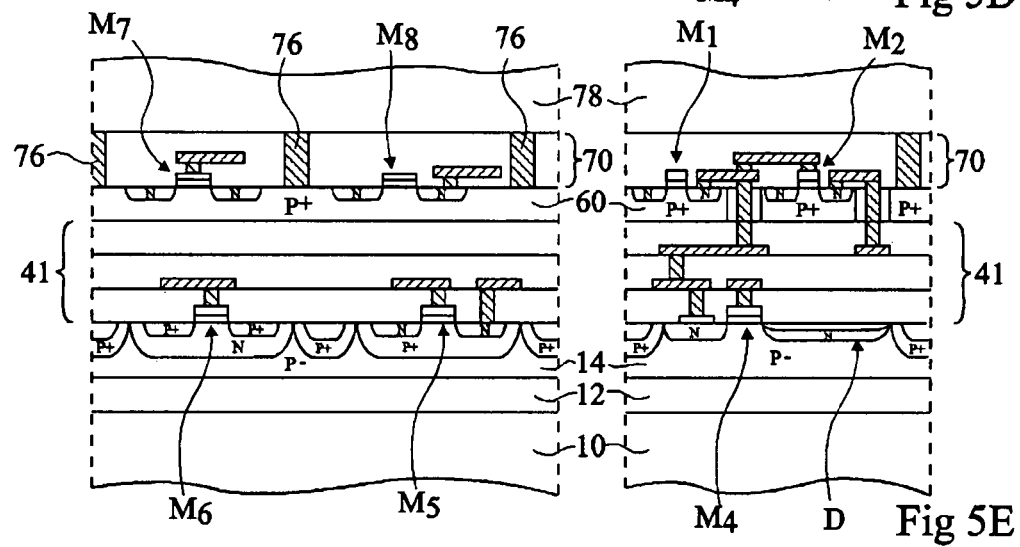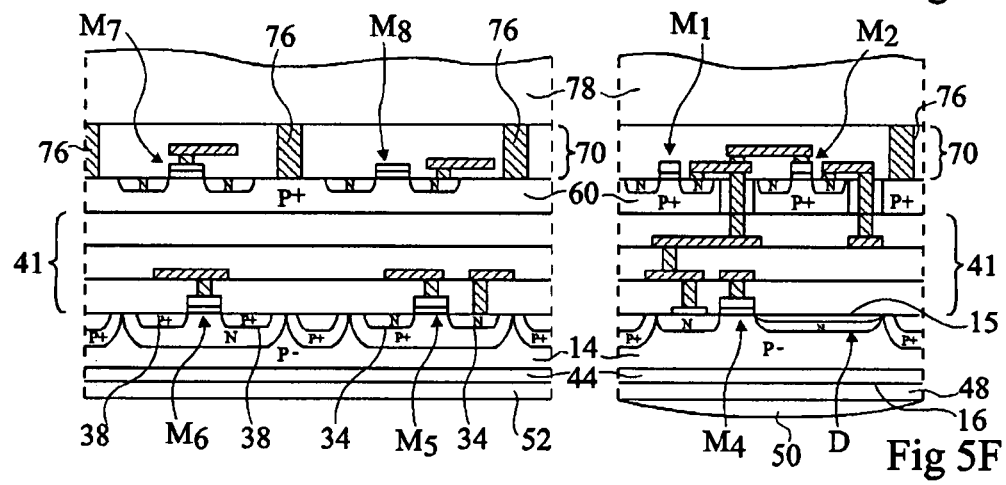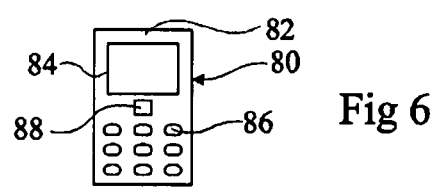

BACK-LIT IMAGE SENSOR WITH A UNIFORM SUBSTRATE TEMPERATURE

BACKGROUND OF THE INVENTION

1. Field of the Invention

The present invention relates to an image sensor made in monolithic form intended to be used in shooting devices such as, for example, film cameras, camcorders, cell phones, or again digital photographic cameras.

2. Discussion of the Related Art

FIG. 1 schematically illustrates an example of a circuit of a photosensitive cell of an array of photosensitive cells of an image sensor. With each photosensitive cell of the array are associated a precharge device and a read device. The precharge device is formed of an N-channel MOS transistor $M_1$, interposed between a supply rail Vdd and a read node S. The gate of precharge transistor $M_1$ is capable of receiving a precharge control signal RST. The read device is formed of the series connection of first and second N-channel MOS transistors $M_2$, $M_3$. The drain of first read transistor $M_2$ is connected to supply rail Vdd. The source of second read transistor $M_3$ is connected to an input terminal P of a processing circuit (not shown). The gate of first read transistor $M_2$ is connected to read node S. The gate of second read transistor $M_3$ is capable of receiving a read signal RD. The photosensitive cell comprises a photodiode D having its anode connected to a reference supply source GND, for example, the circuit ground, and having its cathode connected to node S via an N-channel charge transfer MOS transistor $M_4$. The gate of transfer transistor $M_4$ is capable of receiving a charge transfer control signal T. Generally, signals RD, RST, and T are provided by control circuits, not shown in FIG. 1, and may be provided to all the photosensitive cells of a same row of the cell array. Node S behaves a as charge storage region, the apparent capacitance at read node S being formed of the source capacitances of transistors $M_1$ and $M_4$, of the input capacitance of transistor $M_2$, as well as of all the stray capacitances present at node S. According to a variation, a specific diode having its cathode connected to node S and having its anode connected to ground may be provided.

The operation of this circuit will now be described. A photodetection cycle starts with a precharge phase during which a reference voltage level is imposed at read node S. This precharge is performed by turning on precharge transistor $M_1$. Once the precharge has been performed, precharge transistor $M_1$ is turned off. The reference charge state at node S is then read. The cycle carries on with a transfer to node S of the photogenerated charges, that is, those created and stored in the presence of radiation, in photodiode D. This transfer is performed by turning on transfer transistor $M_4$. Once the transfer is over, transistor $M_4$ is turned off, and photodiode D starts photogenerating and storing charges which will be subsequently transferred to node S. Simultaneously, at the end of the transfer, the new charge state at node S is read. The output signal transmitted to terminal P then depends on the channel pinch of first read transistor $M_2$, which is a direct function of the charge stored in the photodiode.

FIG. 2 shows a simplified top view of an image sensor made in monolithic form. FIG. 2 illustrates a conventional example of distribution of the electronic components (photodiodes and transistors) associated with the image sensor. The transistors and the photodiodes associated with the photosensitive cells are generally formed at the center of the image sensor at the level of block 1 (pixels). The transistors of the peripheral circuits which, generally, carry out various processings of the signals associated with the photosensitive cells, are formed all around block 1. As an example, blocks 2 (readout) correspond to the circuits dedicated to the provision of the control signals of the array of photosensitive cells and to the reading of the signals provided by the photosensitive cells (especially the previously-mentioned processing circuits). Generally, other peripheral circuits may be provided to perform additional functions directly at the level of the image sensor, such as, for example, the correction of faults of the signals read from the read nodes of the photosensitive cells, the image storage, signal processing operations, etc. Thus, block 3 (memory) may correspond to peripheral circuits dedicated to the storage of images. Blocks 4 (digital) may correspond to peripheral circuits dedicated to the performing of signal processing operations. Blocks 5 may correspond to the peripheral circuits dedicated to the processing of input/output interface signals, and especially comprise transistors which are directly connected to the connection pads of the image sensor.

Conventionally, the electronic components of the image sensor are formed at the level of a substrate of a semiconductor material, for example, a silicon wafer, covered with a stack of insulating layers at the level of which are formed the conductive tracks and vias enabling connection of the electronic components of the image sensor. The stack of insulating layers is covered, at least at its central portion, with colored filters and lenses associated with the photosensitive cells, with the possibility for the colored filters not to be present when the image sensor is a black and white sensor. Such an image sensor is said to be front-lit.

A disadvantage of a front-lit image sensor is that the straight path of the light rays from each lens to the photodiode of the associated photosensitive cell may be hindered by the tracks and the conductive vias present at the level of the insulating layer stack covering the substrate. It may then be necessary to provide additional optical devices, in addition to the previously-mentioned lenses, to make sure that most of the light rays which reach the front surface of the image sensor reach the photodiodes of the photosensitive cells. This then results in image sensors that may have a relatively complex structure, difficult to form.

A solution to avoid the use of additional optical devices and/or to improve the light absorption at the level of the image sensor substrate comprises lighting the image sensor through the rear surface of the substrate at the level of which the photodiodes are formed. The image sensor is said to be back-lit.

FIG. 3 shows an example of conventional monolithic forming of a back-lit image sensor. In the right-hand portion, the photodiode D and the transistor $M_4$ of a photosensitive cell of the image sensor have been shown and, in the left-hand portion, two MOS transistors $M_5$ and $M_6$ associated with the peripheral circuits of the image sensor have been shown. The image sensor comprises a lightly-doped P-type substrate 14 (P$^-$) comprising a front surface 15 and a rear surface 16. The photosensitive cell and the transistors of the peripheral circuits are, as an example, delimited by field insulation regions 20, for example, made of silicon oxide, each surrounded with a P-type region 22 more heavily doped than substrate 14 (P$^+$). Photodiode D comprises an N-type region 24 formed in substrate 14. In the case where photodiodes of fully depleted type are used, region 24 is covered with a P-type region 26 more heavily doped than substrate 14. An N-type region 28, formed in substrate 14, corresponds to the drain region of transistor $M_4$. An insulating region 30 extends on front surface 16 of substrate 14, between regions 28 and 24 and corresponds to the gate oxide of transistor $M_4$. Insulating portion 30 is covered with a polysilicon portion 32 corresponding to the gate of transistor $M_4$. A P-type well 33, formed in substrate 14, more heavily doped than substrate 14 ($P^+$), corresponds to the well of transistor $M_5$. Two N-type regions 34, formed in well 33, correspond to the power terminals of transistor $M_5$. An insulating portion 35 extends between regions 34 and corresponds to the gate oxide of transistor $M_5$. A polysilicon portion 36 covers insulating portion 35 and corresponds to the gate of transistor $M_5$. An N-type well 37, forming substrate 14, corresponds to the well of transistor $M_6$. Two P-type regions 38, formed in well 37, correspond to the power terminals of transistor $M_6$. An insulating portion 39 extends between regions 38 and corresponds to the gate oxide of transistor $M_6$. A polysilicon portion 40 covers insulating region 39 and corresponds to the gate of transistor $M_6$.

Substrate 14 is covered with a stack of insulating layers 41 at the level of which are formed metal tracks 44 of different metallization levels and metal vias 46 enabling connection of the components of the photosensitive cells and of the peripheral circuits. Stack 41 is covered with an insulating layer 42. A reinforcement 43, for example corresponding to a solid silicon wafer, covers insulating layer 42. A P-type implantation 44, more heavily doped than the substrate, is formed of the side of rear surface 16 of substrate 14. When the image sensor is a color sensor, a colored filter 48 covered with a lens 50 on the side of rear surface 16 of substrate 14 is provided. At the level of the peripheral circuits, an insulating layer 52 covers rear surface 16 of substrate 14.

A back-lit image sensor has the advantage that the path of the light rays which reach the sensor on the side of rear surface 16 is not hindered by metal tracks and vias 44, 46 provided at the level of insulating layer stack 41.

Among the peripheral circuits, some exhibit a significant heat dissipation. This concerns, for example, power supply generation circuits, high-frequency output stages, phase-locked loops, etc. A disadvantage is that an image sensor is very sensitive to temperature. Indeed, the operating principle of the image sensor corresponds to the absorption of photons in substrate 14, which causes the generation of electron/hole pairs, the electrons being captured by the photodiodes of the photosensitive cells. However, thermal electrons are also capable of being captured by the photodiodes. This translates as the occurrence of a thermal noise at the level of the signals measured from the read node of a photosensitive cell which is generally called "dark current". When present, it is preferable that the dark current be substantially identical for all the photosensitive cells of the image sensor so that the signals measured at the read nodes, in particular in case of a low lighting, have a substantially uniform amplitude. It is thus desirable for the substrate in which the photodiodes of the photosensitive cells are formed to be maintained at as uniform a temperature as possible and, if possible, at a temperature which remains moderate.

When the image sensor is front-lit, the substrate in which the electronic components of the image sensor are formed generally has a thickness of several hundreds of micrometers. Such a substrate enables a good carrying off of the heat generated by high thermal dissipation circuits. Further, the substrate is generally arranged at the level of a thermally conductive package further easing the heat carrying-off. Thereby, the substrate temperature remains substantially uniform, which enables keeping a relatively constant dark current, when present, through all the photosensitive cells.

A difficulty appears when the image sensor is back-lit since substrate 14 then has a low thickness, for example, on the order of a few micrometers, and is thermally isolated. It is then difficult to carry off the heat generated by peripheral circuits with a significant heat dissipation. This translates as local temperature variations that may cause a local increase in the dark current.

SUMMARY OF THE INVENTION

At least one embodiment of the present invention aims at a back-lit image sensor comprising circuits with a significant heat dissipation, which enables maintaining the substrate at the level of which the electronic components of the image sensor are formed at a substantially uniform temperature.

According to at least one embodiment of the present invention, the image sensor is capable of being formed by a method compatible with CMOS technologies.

At least one embodiment of the present invention also aims at a method for manufacturing a back-lit image sensor comprising circuits with a significant heat dissipation which enables maintaining the substrate at the level of which the electronic components of the image sensor are formed at a substantially uniform temperature.

To achieve all or part of these aims, as well as others, an aspect of the present invention provides an image sensor comprising photosensitive cells comprising photodiodes and at least one additional circuit with a significant heat dissipation comprising transistors. The image sensor is made in monolithic form and comprises a layer of a semiconductor material having first and second opposite surfaces and comprising, on the first surface side, regions corresponding to the power terminals of the transistors, the lighting of the image sensor being intended to be performed on the second surface side; a stack of insulating layers covering the first surface; a thermally conductive reinforcement covering the stack on the side opposite to the layer; and thermally conductive vias connecting the layer to the reinforcement.

According to an embodiment of the present invention, the layer further comprises, on the first surface side, additional regions corresponding to the photodiodes.

According to an embodiment of the present invention, the regions are arranged at the periphery of the additional regions.

According to an embodiment of the present invention, the vias are formed at least at the level of said regions.

According to an embodiment of the present invention, the thickness of the layer is lower than 5 μm.

According to an embodiment of the present invention, the image sensor further comprises an additional layer of a semiconductor material having third and fourth opposite surfaces and comprising, on the third surface side, additional regions corresponding to the photodiodes, the additional layer being intended to be lit on its fourth surface; and an additional stack of insulating layers interposed between the third surface of the additional layer and the second surface of the layer.

According to an embodiment of the present invention, the image sensor further comprises at least one insulating portion in the layer; at least one electrically-conductive via crossing the insulating portion and connecting a first electrically-conductive track arranged in the stack and a second electrically-conductive track arranged in the additional stack.

Another aspect of the present invention provides a method for manufacturing an image sensor comprising photosensitive cells comprising photodiodes and at least one peripheral circuit with a significant heat dissipation comprising transistors. The method comprises the steps of forming a layer of a semiconductor material having first and second opposite surfaces, the lighting of the sensor being intended to be performed on the second surface side; forming in the layer, on the first surface side, regions corresponding to the power terminals of the transistors; covering the first surface with a stack of insulating layers and forming, in the stack, thermally-conductive vias; and covering the stack with a thermally-conductive reinforcement, the vias connecting the layer to the reinforcement.

According to an embodiment of the present invention, the method further comprises the step of forming in the layer, on the first surface side, additional regions corresponding to the photodiodes.

According to an embodiment of the present invention, the method further comprises the steps of forming an additional layer of a semiconductor material comprising third and fourth opposite surfaces, the additional layer being intended to be lit on its fourth surface; forming, in the additional layer, on the third surface side, additional regions corresponding to the photodiodes; and covering the third surface with an additional stack of insulating layers, said layer covering, on the second surface side, the additional stack.

The foregoing and other objects, features, and advantages of the present invention will be discussed in detail in the following non-limiting description of specific embodiments in connection with the accompanying drawings.

BRIEF DESCRIPTION OF THE DRAWINGS

FIGS. 5A to 5F illustrate the successive steps of an example of a method for manufacturing a back-lit image sensor according to an embodiment of the present invention; and FIG. 6 schematically shows a cell phone comprising an image sensor according to the present invention.

DETAILED DESCRIPTION

Figure 1:
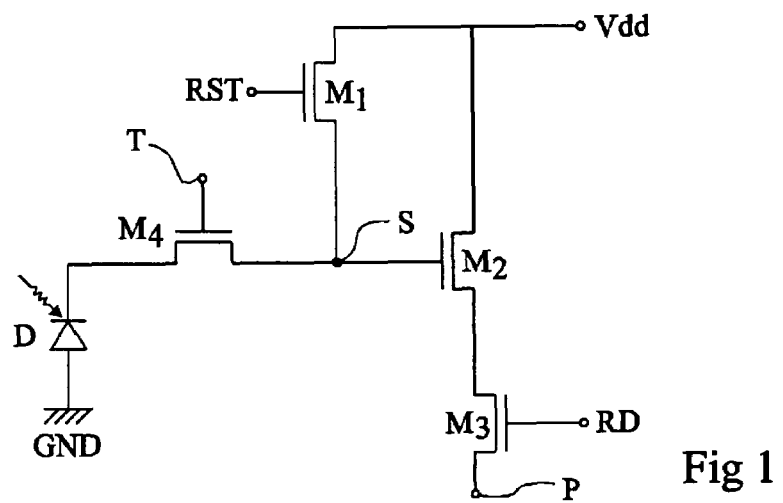
FIG. 1, previously described, shows an electric diagram of a photosensitive cell.
Figure 2:
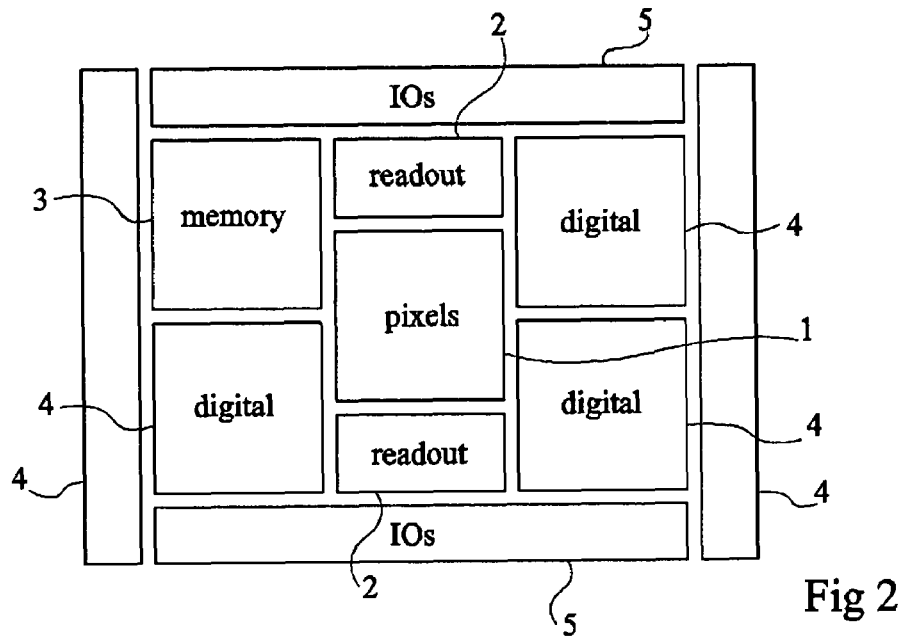
FIG. 2, previously described, shows a example of distribution of the components of the image sensor made in monolithic form.

For clarity, the same elements have been designated with the same reference numerals in the different drawings and, further, as usual in the representation of integrated circuits, the various drawings are not to scale.

An aspect of the present invention comprises, for a back-lit image sensor, carrying off the heat generated by circuits with a significant heat dissipation towards the image sensor reinforcement through the stack of insulating layers separating the substrate from the reinforcement.

Figure 3:
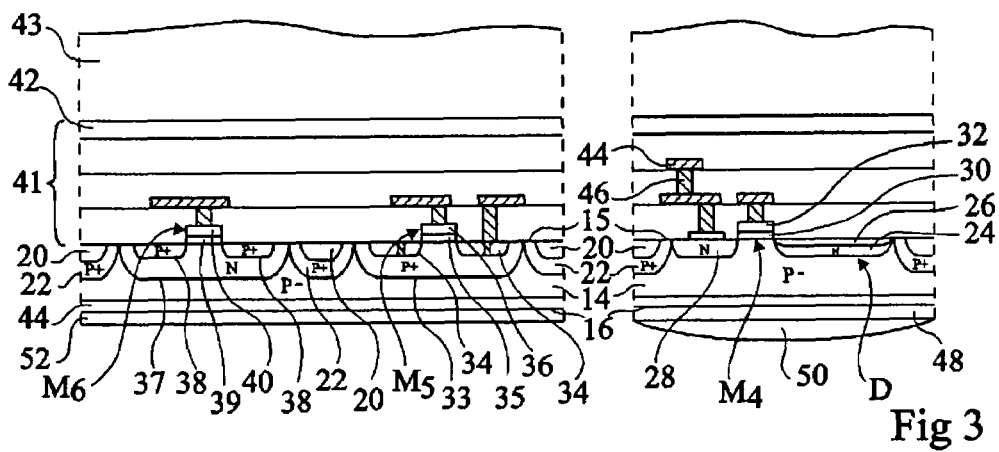
FIG. 3, previously described, shows a conventional example of monolithic embodiment of a back-lit image sensor.

FIGS. 4A to 4E illustrate an example of a method for manufacturing a first embodiment of a back-lit image sensor according to the present invention. The elements common with FIG. 3 have been designated with the same reference numerals.

Figure 4A:
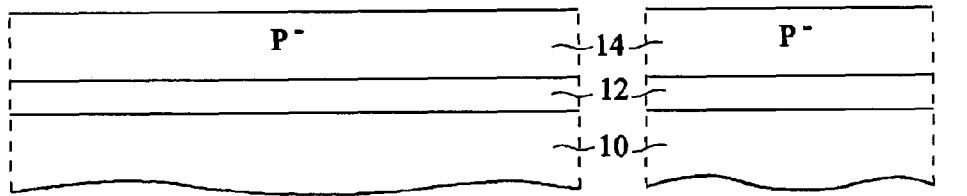
FIGS. 4A to 4E illustrate the successive steps of an example of a method for manufacturing a first embodiment of a back-lit image sensor according to the present invention.

FIG. 4A shows a solid silicon support 10 covered with an insulating layer 12, for example, a thermal oxide. Substrate 14 is formed on insulating layer 12 with the possible interposition of a seed layer. Substrate 14 has a thickness of a few micrometers, preferably lower than 5 μm. Such a structure corresponds to an SOI structure (silicon on insulator).

Figure 4B:
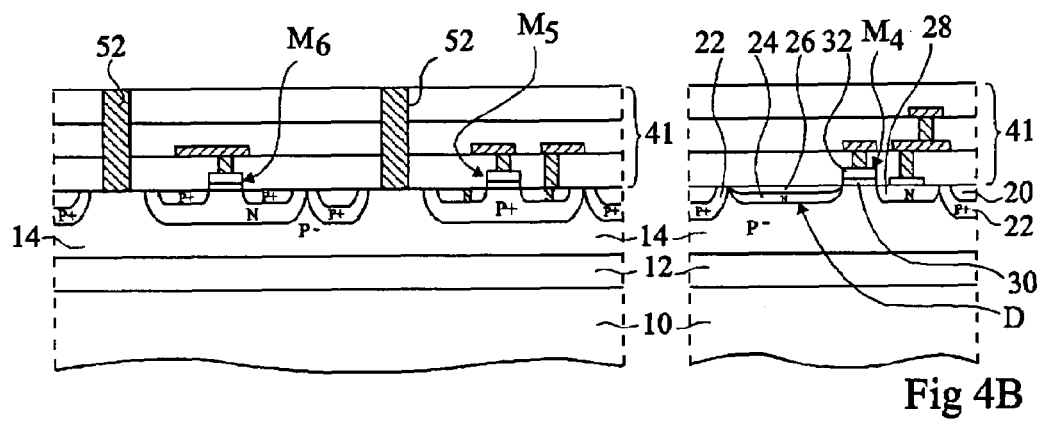

FIG. 4B shows the structure obtained after having formed all the electronic components of the photosensitive cells and of the peripheral circuits, as well as stack 41 of insulating layers, metal tracks 44, and vias 46. For each photosensitive cell, although only photodiode D and transistor $M_4$ are shown in FIG. 4B, the other cell transistors, that is, transistors $M_1$, $M_2$, and $M_3$, are also formed at the level of substrate 14. The first embodiment according to the present invention provides forming, at the level of the peripheral circuits, vias 52 crossing the entire insulating layer stack 41 and having one end at the contact of substrate 14. It is possible to only provide vias 52 at the level of the peripheral circuits with a significant heat dissipation or at the level of all the peripheral circuits. The density of vias 52 at the level of the peripheral circuits with a significant heat dissipation may be greater than for the other peripheral circuits. Vias 52 are made of a material which is a good heat conductor but not necessarily a good electric conductor. As an example, vias 52 may be made of copper or aluminum nitride (AlN).

Figure 4C:
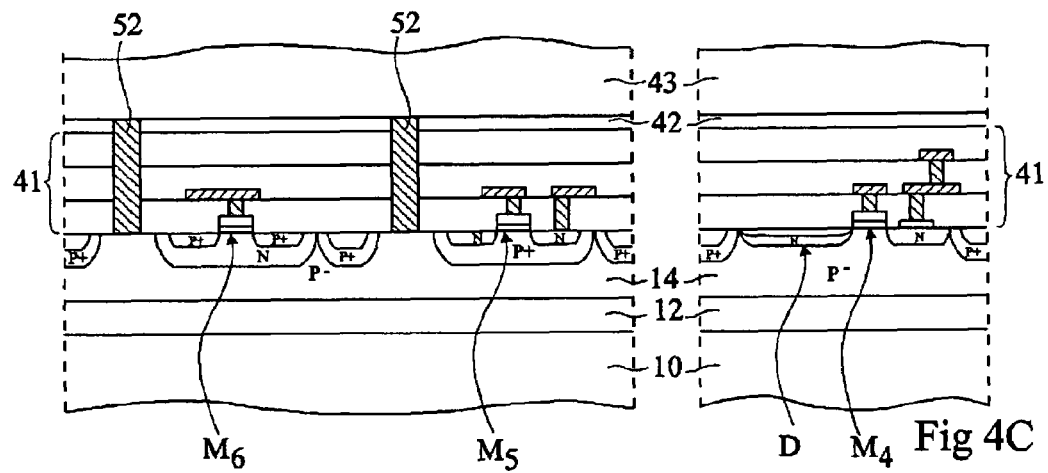

FIG. 4C shows the structure obtained after having glued, on the upper surface of insulating layer stack 41, a strengthening element formed, for example, of the stack of insulating layer 42 and of silicon reinforcement 43, vias 52 being extended through insulating layer 42 to come into contact with silicon reinforcement 43. Reinforcement 43 may have a thickness of a few hundreds of micrometers.

Figure 4D:
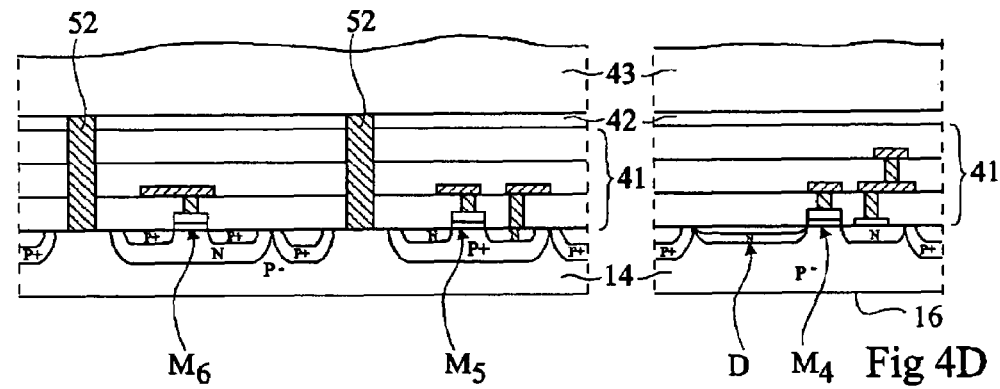

FIG. 4D shows the structure obtained after a "thinning" step which comprises removing, for example, by chemical or chem./mech. etch, support 10 and insulating layer 12 to expose lower surface 16 of substrate 14. Support 10 and insulating layer 12 may be removed by etching, where the etch stop can be obtained by playing on the selectivity differences between insulating layer 12 and substrate 14. According to an alternative embodiment, substrate 14 corresponds to a lightly-doped P-type silicon layer formed by epitaxy on a more heavily-doped P-type solid silicon support. In this case, the thinning step comprises removing the silicon support, for example by etching, where the etch stop can be obtained by playing on the selectivity differences between epitaxial layer 14 and the support.

Figure 4E:
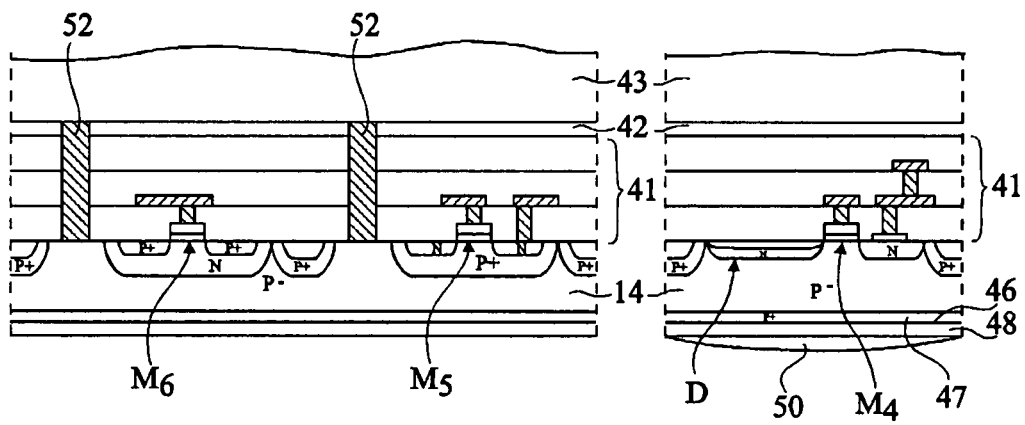

FIG. 4E shows the structure obtained after having formed P-type region 44 more heavily doped than substrate 14 on the side of rear surface 16 and after having formed, on rear surface 16, colored filters 48 and lenses 50 associated with the photosensitive cells of the image sensor and insulating layer 52 at the level of the peripheral circuits. Region 44 may be formed by implantation at the level of rear surface 16 of substrate 14, followed by an activation anneal.

The first example of an image sensor according to the present invention has the advantage, in operation, that the heat provided by the peripheral circuits with a significant heat dissipation is carried off, via vias 52, to reinforcement 43, thus maintaining substrate 14 at a substantially uniform temperature. Further, reinforcement 43 may itself be attached on a conductive package to further improve the heat carrying off.

FIGS. 5A to 5F illustrate the steps of an example of a method for manufacturing a second embodiment of a back-lit image sensor according to the present invention.

Figure 5A:
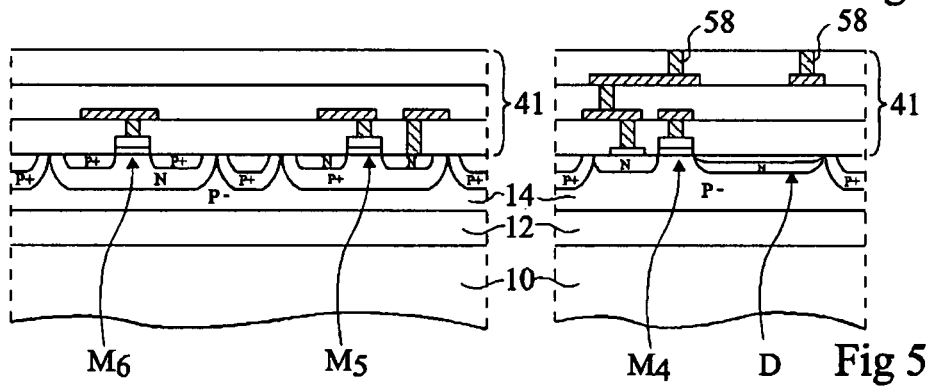

FIG. 5A illustrates the structure obtained after steps similar to those which have been previously described for the method for manufacturing the first embodiment of the image sensor according to the present invention in relation with FIGS. 4A and 4B. However, conversely to what has been previously described, only photodiode D and transfer transistor $M_4$ are formed for each photosensitive cell. As to the peripheral circuits, only the components which do not exhibit a significant heat dissipation are formed. Further, vias 52 are not formed. Moreover, vias 58 which extend to the upper surface of stack 41 of insulating layers are provided.

Figure 5B:
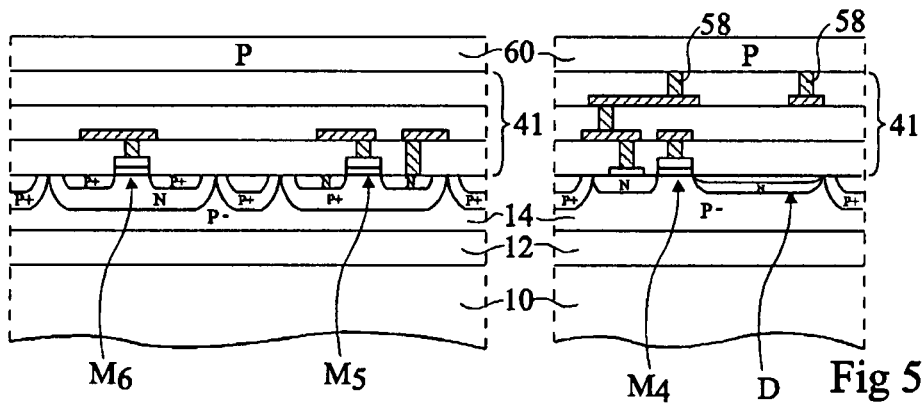

FIG. 5B shows the structure obtained after having formed on the stack of insulating layers 41 a P-type single-crystal silicon layer 60, possibly more heavily doped than substrate 14. The thickness of layer 60 may vary from some twenty nanometers to a few micrometers and is, preferably, lower than 5 μm. Generally, layer 60 may be very thin since the function of absorption of the light reaching the image sensor is not fulfilled with this layer 60. Layer 60 may be formed by depositing amorphous silicon on stack 41 of insulating layers and by carrying out a step of recrystallization of the amorphous silicon layer by a method which does not cause too high a rise in the temperature of the rest of the image sensor, in particular, of stack 41 of insulating layers. Indeed, an excessive rise in the temperature of stack 41 may cause a deterioration of the materials used to form insulating layers 41 and conductive tracks and vias 44, 46. As an example, when metal tracks 44 are made of copper, the temperature of stack 41 should not exceed 400° C. For this purpose, the recrystallization of the amorphous silicon layer may be obtained by a general heating of the image sensor at low temperature or by a local heating of the amorphous silicon layer, for example via a laser.

Figure 5C:
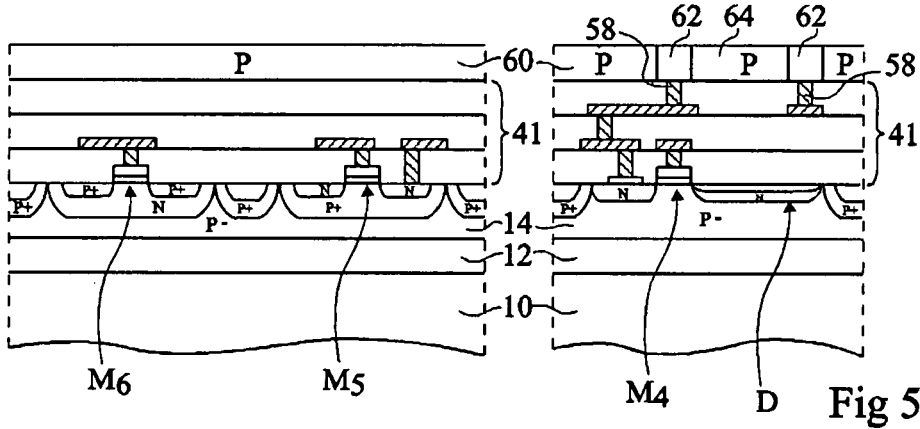

FIG. 5C shows the structure obtained after having formed in layer 60 insulating portions 62 resulting in the forming of islands 64 in insulating layer 60. As an example, insulating portions 62 may be obtained by etching layer 60 across its entire thickness and by filling the obtained openings with an insulating material, for example, silicon oxide. Insulating portions 62 cover the ends of vias 58. According to a variation of the second example of embodiment, insulating portions 62 correspond to the openings made in layer 60, which are left as such.

FIG. 5D shows the structure obtained after having formed MOS transistors at the level of layer 60 and after having covered layer 60 with a stack of insulating layers 70. As an example, MOS transistors $M_1$ and $M_2$ have been shown on the photosensitive cell side, and two MOS transistors $M_7$ and $M_8$ have been shown on the peripheral circuit side. Generally, on the photosensitive cell side, all the transistors of photosensitive cell other than transfer transistor $M_4$ are formed for each photosensitive cell, and on the peripheral circuit side, all the components which have not already been formed at the level of substrate 14, that is, especially the components of the peripheral circuits with a significant heat dissipation, are formed.

The methods for manufacturing transistors $M_1$, $M_2$, $M_7$, $M_8$ are capable of not causing an excessive rise in the temperature of the rest of the image sensor. As an example, materials with a strong dielectric coefficient, for example, Hafnium oxide, which may be deposited by low-temperature methods, may be used to form the transistor gates, or conventional insulating materials which are then deposited at low temperature, for example, by plasma methods, may be used. Further, the transistor gates may be formed by the deposition of a material based on titanium nitride TiN by an atomic layer deposition or ALD method or by a chemical vapor deposition method CVD. Conductive tracks and conductive vias 72 ensuring the interconnection of the transistors are formed at the level of insulating layer stack 70. In particular, vias 74 are formed at the level of insulating portions 62 to come into contact with the vias 58 provided at the level of the stack of insulating layers 41. Further, heat drainage vias 76 which cross the entire insulating layer stack 70 and come into contact at one end with semiconductor layer 60 are provided. Vias 76 may be formed at the level of the entire layer 60, possibly by increasing the density of vias 76 close to the peripheral circuits with a significant heat dissipation. According to a variation, it is possible to only form vias 76 at the level of all the peripheral circuits formed at the level of layer 60, or only at the level of the peripheral circuits with a significant heat dissipation. Vias 76 are formed of a material which is a good heat conductor but not necessarily a good electric conductor.

FIG. 5E shows the structure obtained after having covered insulating layer stack 70 with a reinforcement 78 of a thermally conductive material, for example, a solid silicon wafer. Reinforcement 78 may have a thickness of several hundreds of micrometers. Vias 76 come into contact with reinforcement 78.

FIG. 5F shows the structure obtained after having performed the thinning step previously described for the manufacturing method of the first embodiment of the image sensor according to the present invention in relation with FIG. 4D and after having formed filters 48, lenses 50 and insulating layer 52 as described previously for the method for manufacturing the first embodiment of the image sensor according to the present invention in relation with FIG. 4E.

In operation, the heat generated by the components formed in layer 60 of the peripheral circuits with a significant heat dissipation is carried off to reinforcement 78 via vias 76. Further, reinforcement 78 may be attached to a thermally conductive package further improving the heat carrying off. Since the circuits with a significant heat dissipation are not present at the level of substrate 14, the temperature of substrate 14 remains substantially uniform.

FIG. 6 illustrates an example of use of the image sensor according to the present invention. FIG. 6 very schematically shows a cell phone 80 comprising a package 82 at the level of which are arranged a screen 84 and a keyboard 86. Cell phone 80 also comprises an image acquisition system 88 comprising an optical system directing the light rays towards an image sensor according to an embodiment of the present invention.

Of course, the present invention is likely to have various alterations, modifications, and improvements which will readily occur to those skilled in the art. In particular, the present invention also applies to a photosensitive cell for which several photodiodes are connected to a same read node. Further, although the present invention has been described for an image sensor cell in which the precharge device and the read device have a specific structure, the present invention also applies to a cell for which the precharge device or the read device have a different structure, for example, comprise a different number of MOS transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor comprising photosensitive cells comprising photodiodes and at least one additional circuit with a significant heat dissipation comprising transistors, made in monolithic form and comprising:

a layer of a semiconductor material having a thickness less than 5 microns and first and second opposite surfaces and comprising, on a first surface side, regions corresponding to power terminals of the transistors, the lighting of the image sensor being intended to be performed on a second surface side;

a single stack of insulating layers covering said first surface;

a thermally conductive reinforcement having a thickness greater than 200 microns and covering the stack on the side opposite to said layer, the photodiodes being arranged on a same side of the reinforcement as the transistors; and thermally conductive vias connecting said layer to the reinforcement.

2. The image sensor of claim 1, wherein said layer further comprises, on said first surface side, additional regions corresponding to the photodiodes.

3. The image sensor of claim 2, wherein said regions are arranged at the periphery of the additional regions.

4. The image sensor of claim 1, wherein said vias are formed at least at the level of said regions.

5. The image sensor of claim 1, further comprising:

an additional layer of a semiconductor material having third and fourth opposite surfaces and comprising, on the third surface side, additional regions corresponding to the photodiodes, the additional layer being intended to be lit on its fourth surface; and an additional stack of insulating layers interposed between the third surface of the additional layer and the second surface of said layer.

6. The image sensor of claim 5, further comprising:

at least one insulating portion in said layer;

at least one electrically-conductive via crossing the insulating portion and connecting a first electrically-conductive track arranged in the stack and a second electrically-conductive track arranged in the additional stack.

7. A method for manufacturing an image sensor comprising photosensitive cells comprising photodiodes and at least one peripheral circuit with a significant heat dissipation comprising transistors, comprising the steps of:

forming a layer of a semiconductor material having a thickness less than 5 microns and first and second opposite surfaces, the lighting of the sensor being intended to be performed on the second surface side;

forming in said layer, on the first surface side, regions corresponding to power terminals of the transistors;

covering the first surface with a single stack of insulating layers and forming, in the stack, thermally-conductive vias; and covering the single stack with a thermally-conductive reinforcement having a thickness greater than 200 microns, the photodiodes being arranged on a same side of the reinforcement as the transistors, said vias connecting said layer to the reinforcement.

8. The method of claim 7, further comprising the step of forming in said layer, on the first surface side, additional regions corresponding to the photodiodes.

9. The method of claim 7, further comprising the steps of:

forming an additional layer of a semiconductor material comprising third and fourth opposite surfaces, the additional layer being intended to be lit on its fourth surface;

forming, in the additional layer, on the third surface side, additional regions corresponding to the photodiodes; and covering the third surface with an additional stack of insulating layers, said layer covering, on the second surface side, the additional stack.

* * * * *

UNITED STATES PATENT AND TRADEMARK OFFICE
CERTIFICATE OF CORRECTION

PATENT NO. : 7,687,872 B2
APPLICATION NO. : 11/880253
DATED : March 30, 2010
INVENTOR(S) : Yvon Cazaux et al.

It is certified that error appears in the above-identified patent and that said Letters Patent is hereby corrected as shown below:

Title page Item 73 should read:
Assignees: STMicroelectronics S.A., Montrouge (FR); Commissariat A l'Energie Atomique, Paris, (FR); STMicroelectronics (Crolles) 2 SAS, Crolles (FR)

Signed and Sealed this

Seventh Day of September, 2010

David J. Kappos
*Director of the United States Patent and Trademark Office*